(12) United States Patent
Jo (10) Patent No.: US 11,733,526 B1
(45) Date of Patent: Aug. 22, 2023

(54) HEAD-MOUNTABLE DEVICE WITH CONVERTIBLE LIGHT SEAL ELEMENT

(71) Applicant: Apple Inc., Cupertino, CA (US)

(72) Inventor: Yoonhoo Jo, Santa Cruz, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 17/379,840

(22) Filed: Jul. 19, 2021

Related U.S. Application Data (60) Provisional application No. 63/082,978, filed on Sep. 24, 2020.

(51) Int. Cl.
  G02B 27/01    (2006.01)
  H01L 51/52    (2006.01)
  G09F 13/04    (2006.01)

(52) U.S. Cl.
  CPC ..... G02B 27/0172 (2013.01); G09F 13/0413 (2013.01); H01L 51/5246 (2013.01); G02B 2027/014 (2013.01); G02B 2027/0138 (2013.01); G02B 2027/0178 (2013.01); G02B 2027/0187 (2013.01)

(58) Field of Classification Search
  CPC ........ G02B 27/0172; G02B 2027/0138; G02B 2027/014; G02B 2027/0178; G02B 2027/0187; G09F 13/0413; H01L 51/5246
  See application file for complete search history.

(56) References Cited

U.S. PATENT DOCUMENTS

| | | | |
|---|---|---|---|
| 8,123,352 B2 | 2/2012 | Matsumoto et al. | |
| 8,217,856 B1 | 7/2012 | Petrou et al. | |
| 10,684,654 B2 | 6/2020 | Shin et al. | |
| 2006/0179554 A1* | 8/2006 | Barton | A61F 9/026 2/426 |
| 2019/0041899 A1* | 2/2019 | Ellis | G02B 27/0176 |
| 2020/0310118 A1* | 10/2020 | Kamakura | G06F 1/1647 |
| 2021/0149202 A1* | 5/2021 | Machida | G02B 5/003 |
| 2021/0173480 A1* | 6/2021 | Osterhout | G06F 3/03547 |
| 2021/0208393 A1* | 7/2021 | Clark | G02B 27/017 |

* cited by examiner

Primary Examiner — Alexander Eisen
Assistant Examiner — Kebede T Teshome
(74) Attorney, Agent, or Firm — BakerHostetler (57) ABSTRACT

A head-mountable device can provide convertible components that selectively engage the face of the user to exclude light from an external environment or open to provide a direct view to the external environment. A head-mountable device can include a light seal element that includes peripheral portions that transition between extended and collapsed configurations while the head-mountable device is worn by a user. Such peripheral portions can also transition between configurations to facilitate compact storage of the head-mountable device.

16 Claims, 6 Drawing Sheets

HEAD-MOUNTABLE DEVICE WITH CONVERTIBLE LIGHT SEAL ELEMENT

CROSS-REFERENCE TO RELATED APPLICATION

This application claims the benefit of U.S. Provisional Application No. 63/082,978, entitled "HEAD-MOUNTABLE DEVICE WITH CONVERTIBLE LIGHT SEAL ELEMENT," filed Sep. 24, 2020, the entirety of which is incorporated herein by reference.

TECHNICAL FIELD

The present description relates generally to head-mountable devices, and, more particularly, to light seal elements of head-mountable devices having convertible configurations.

BACKGROUND

A head-mountable device can be worn by a user to display visual information within the field of view of the user. The head-mountable device can be used as a virtual reality (VR) system, an augmented reality (AR) system, and/or a mixed reality (MR) system. A user may observe outputs provided by the head-mountable device, such as visual information provided on a display. The display can optionally allow a user to observe an environment outside of the head-mountable device. Other outputs provided by the head-mountable device can include speaker output and/or haptic feedback. A user may further interact with the head-mountable device by providing inputs for processing by one or more components of the head-mountable device. For example, the user can provide tactile inputs, voice commands, and other inputs while the device is mounted to the user's head.

BRIEF DESCRIPTION OF THE DRAWINGS

Certain features of the subject technology are set forth in the appended claims. However, for purpose of explanation, several embodiments of the subject technology are set forth in the following figures.

DETAILED DESCRIPTION

The detailed description set forth below is intended as a description of various configurations of the subject technology and is not intended to represent the only configurations in which the subject technology may be practiced. The appended drawings are incorporated herein and constitute a part of the detailed description. The detailed description includes specific details for the purpose of providing a thorough understanding of the subject technology. However, it will be clear and apparent to those skilled in the art that the subject technology is not limited to the specific details set forth herein and may be practiced without these specific details. In some instances, well-known structures and components are shown in block diagram form in order to avoid obscuring the concepts of the subject technology.

Head-mountable devices, such as head-mountable displays, headsets, visors, smartglasses, head-up display, etc., can perform a range of functions that are managed by the components (e.g., sensors, circuitry, and other hardware) included with the wearable device.

It can be desirable to provide a head-mountable device with various configurations that can alternately be achieved to provide different user experiences and/or to manage conditions for the user during use. For example, a user can be provided with either an immersive experience that focuses on the visual content output by the head-mountable device or a partially open experience that includes a view of an external environment. Such a view can be provided without requiring removal of the head-mountable device.

The various configurations that can further be used to enhance both usage and storage of the device. For example, in use the display elements of a head-mountable device can be desirably positioned with respect to the user's eyes while engaging the head and/or face of the user. At other times, it can be desirable to store the head-mountable device in a more compact form to reduce space occupancy and/or to engage with other devices, such as a charging station.

Embodiments of the present disclosure provide a head-mountable device that provides convertible components that selectively engage the face of the user to exclude light from an external environment or open to provide a direct view to the external environment. A head-mountable device can include a light seal element that includes peripheral portions that transition between extended and collapsed configurations while the head-mountable device is worn by a user. Such peripheral portions can also transition between configurations to facilitate compact storage of the head-mountable device.

These and other embodiments are discussed below with reference to FIGS. 1-8. However, those skilled in the art will readily appreciate that the detailed description given herein with respect to these Figures is for explanatory purposes only and should not be construed as limiting.

Figure 1:
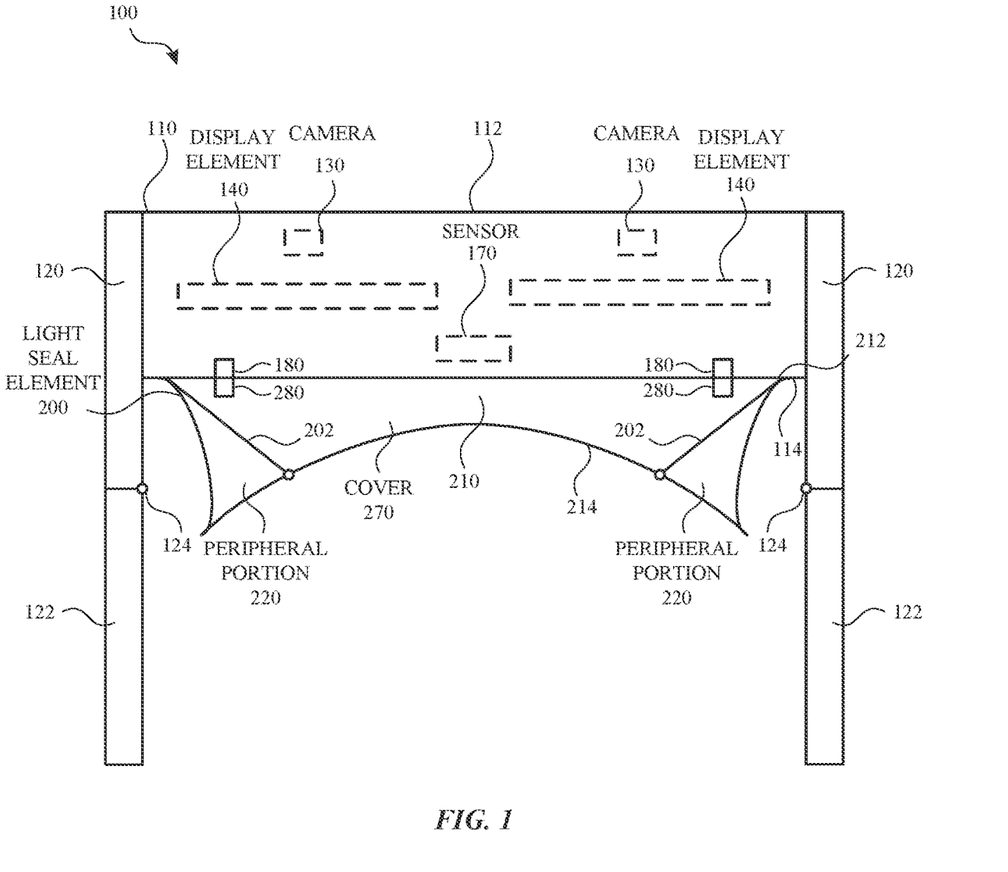
FIG. 1 illustrates a top view of a head-mountable device with a light seal in an extended configuration and arms in a deployed configuration, according to some embodiments of the present disclosure.

According to some embodiments, for example as shown in FIG. 1, a head-mountable device 100 includes a frame 110 and a light seal element 200 that are worn on a head of a user. The frame 110 can be positioned in front of the eyes of a user to provide information within a field of view of the user. The frame 110 and/or the light seal element 200 can provide a nosepiece to rest on a user's nose.

The frame 110 can provide structure around a peripheral region thereof to support any internal components of the frame 110 in their assembled position. For example, the frame 110 can enclose and support various internal components (including for example integrated circuit chips, processors, memory devices and other circuitry) to provide computing and functional operations for the head-mountable device 100, as discussed further herein. While several components are shown within the frame 110, it will be understood that some or all of these components can be located anywhere within or on the head-mountable device 100. For example, one or more of these components can be positioned within the light seal element 200, an extension 120, and/or an arm 122 of the head-mountable device 100.

The frame 110 can include and/or support one or more cameras 130. The cameras 130 can be positioned on or near an outer side 112 of the frame 110 to capture images of views external to the head-mountable device 100. As used herein, an outer side of a portion of a head-mountable device is a side that faces away from the user and/or towards an external environment. The captured images can be used for display to the user or stored for any other purpose. Each of the cameras 130 can be movable along the outer side 112. For example, a track or other guide can be provided for facilitating movement of the camera 130 therein.

The head-mountable device 100 can include display elements 140 that provide visual output for viewing by a user wearing the head-mountable device 100. One or more display elements 140 can be positioned on or near an inner side 114 of the frame 110. As used herein, an inner side 114 of a portion of a head-mountable device is a side that faces toward the user and/or away from the external environment.

A display element 140 can transmit light from a physical environment (e.g., as captured by a camera) for viewing by the user. Such a display element 140 can include optical properties, such as lenses for vision correction based on incoming light from the physical environment. Additionally or alternatively, a display element 140 can provide information as a display within a field of view of the user. Such information can be provided to the exclusion of a view of a physical environment or in addition to (e.g., overlaid with) a physical environment.

A physical environment refers to a physical world that people can sense and/or interact with without aid of electronic systems. Physical environments, such as a physical park, include physical articles, such as physical trees, physical buildings, and physical people. People can directly sense and/or interact with the physical environment, such as through sight, touch, hearing, taste, and smell.

In contrast, a computer-generated reality (CGR) environment refers to a wholly or partially simulated environment that people sense and/or interact with via an electronic system. In CGR, a subset of a person's physical motions, or representations thereof, are tracked, and, in response, one or more characteristics of one or more virtual objects simulated in the CGR environment are adjusted in a manner that comports with at least one law of physics. For example, a CGR system may detect a person's head turning and, in response, adjust graphical content and an acoustic field presented to the person in a manner similar to how such views and sounds would change in a physical environment. In some situations, (e.g., for accessibility reasons), adjustments to characteristic(s) of virtual object(s) in a CGR environment may be made in response to representations of physical motions (e.g., vocal commands).

A person may sense and/or interact with a CGR object using any one of their senses, including sight, sound, touch, taste, and smell. For example, a person may sense and/or interact with audio objects that create 3D or spatial audio environment that provides the perception of point audio sources in 3D space. In another example, audio objects may enable audio transparency, which selectively incorporates ambient sounds from the physical environment with or without computer-generated audio. In some CGR environments, a person may sense and/or interact only with audio objects.

Examples of CGR include virtual reality and mixed reality.

A virtual reality (VR) environment refers to a simulated environment that is designed to be based entirely on computer-generated sensory inputs for one or more senses. A VR environment comprises a plurality of virtual objects with which a person may sense and/or interact. For example, computer-generated imagery of trees, buildings, and avatars representing people are examples of virtual objects. A person may sense and/or interact with virtual objects in the VR environment through a simulation of the person's presence within the computer-generated environment, and/or through a simulation of a subset of the person's physical movements within the computer-generated environment.

In contrast to a VR environment, which is designed to be based entirely on computer-generated sensory inputs, a mixed reality (MR) environment refers to a simulated environment that is designed to incorporate sensory inputs from the physical environment, or a representation thereof, in addition to including computer-generated sensory inputs (e.g., virtual objects). On a virtuality continuum, a mixed reality environment is anywhere between, but not including, a wholly physical environment at one end and virtual reality environment at the other end.

In some MR environments, computer-generated sensory inputs may respond to changes in sensory inputs from the physical environment. Also, some electronic systems for presenting an MR environment may track location and/or orientation with respect to the physical environment to enable virtual objects to interact with real objects (that is, physical articles from the physical environment or representations thereof). For example, a system may account for movements so that a virtual tree appears stationery with respect to the physical ground.

Examples of mixed realities include augmented reality and augmented virtuality.

An augmented reality (AR) environment refers to a simulated environment in which one or more virtual objects are superimposed over a physical environment, or a representation thereof. For example, an electronic system for presenting an AR environment may have a transparent or translucent display through which a person may directly view the physical environment. The system may be configured to present virtual objects on the transparent or translucent display, so that a person, using the system, perceives the virtual objects superimposed over the physical environment. Alternatively, a system may have an opaque display and one or more imaging sensors that capture images or video of the physical environment, which are representations of the physical environment. The system composites the images or video with virtual objects, and presents the composition on the opaque display. A person, using the system, indirectly views the physical environment by way of the images or video of the physical environment, and perceives the virtual objects superimposed over the physical environment. As used herein, a video of the physical environment shown on an opaque display is called "pass-through video," meaning a system uses one or more image sensor(s) to capture images of the physical environment, and uses those images in presenting the AR environment on the opaque display. Further alternatively, a system may have a projection system that projects virtual objects into the physical environment, for example, as a hologram or on a physical surface, so that a person, using the system, perceives the virtual objects superimposed over the physical environment.

An augmented reality environment also refers to a simulated environment in which a representation of a physical environment is transformed by computer-generated sensory information. For example, in providing pass-through video, a system may transform one or more sensor images to impose a select perspective (e.g., viewpoint) different than the perspective captured by the imaging sensors. As another example, a representation of a physical environment may be transformed by graphically modifying (e.g., enlarging) portions thereof, such that the modified portion may be representative but not photorealistic versions of the originally captured images. As a further example, a representation of a physical environment may be transformed by graphically eliminating or obfuscating portions thereof.

An augmented virtuality (AV) environment refers to a simulated environment in which a virtual or computer generated environment incorporates one or more sensory inputs from the physical environment. The sensory inputs may be representations of one or more characteristics of the physical environment. For example, an AV park may have virtual trees and virtual buildings, but people with faces photorealistically reproduced from images taken of physical people. As another example, a virtual object may adopt a shape or color of a physical article imaged by one or more imaging sensors. As a further example, a virtual object may adopt shadows consistent with the position of the sun in the physical environment.

There are many different types of electronic systems that enable a person to sense and/or interact with various CGR environments. Examples include head-mountable systems, projection-based systems, heads-up displays (HUDs), vehicle windshields having integrated display capability, windows having integrated display capability, displays formed as lenses designed to be placed on a person's eyes (e.g., similar to contact lenses), headphones/earphones, speaker arrays, input systems (e.g., wearable or handheld controllers with or without haptic feedback), smartphones, tablets, and desktop/laptop computers. A head-mountable system may have one or more speaker(s) and an integrated opaque display. Alternatively, a head-mountable system may be configured to accept an external opaque display (e.g., a smartphone). The head-mountable system may incorporate one or more imaging sensors to capture images or video of the physical environment, and/or one or more microphones to capture audio of the physical environment. Rather than an opaque display, a head-mountable system may have a transparent or translucent display. The transparent or translucent display may have a medium through which light representative of images is directed to a person's eyes. The display may utilize digital light projection, OLEDs, LEDs, uLEDs, liquid crystal on silicon, laser scanning light source, or any combination of these technologies. The medium may be an optical waveguide, a hologram medium, an optical combiner, an optical reflector, or any combination thereof. In one embodiment, the transparent or translucent display may be configured to become opaque selectively. Projection-based systems may employ retinal projection technology that projects graphical images onto a person's retina. Projection systems also may be configured to project virtual objects into the physical environment, for example, as a hologram or on a physical surface.

Each display element 140 can be adjusted to align with a corresponding eye of the user. For example, each display element 140 can be moved along one or more axes until a center of each display element 140 is aligned with a center of the corresponding eye. Accordingly, the distance between the display elements 140 can be set based on an interpupillary distance ("IPD") of the user. IPD is defined as the distance between the centers of the pupils of a user's eyes.

As further shown in FIG. 1, the light seal element 200 can include a chassis that provides structural support to one or more other components of the light seal element 200. The chassis 202, or portions thereof, can extend to, from, and/or between the inner side 214 and the outer side 212. The chassis 202 can support a cover 270 that extends at least partially from the outer side 212 to the inner side 214.

As further shown in FIG. 1, attachment elements can facilitate coupling of the frame 110 to the light seal element 200 in a relative position and orientation that aligns the display elements 140 of the frame 110 in a preferred position and orientation for viewing by the user. The frame 110 and the light seal element 200 can be coupled to prevent ingress of light from an external environment. For example, frame attachment elements 180 can releasably engage light seal attachment elements 280. One or more of various mechanisms can be provided to secure the modules to each other. For example, mechanisms such as locks, latches, snaps, screws, clasps, threads, magnets, pins, an interference (e.g., friction) fit, knurl presses, bayoneting, and/or combinations thereof can be included to couple and/or secure the frame 110 and the light seal element 200 together. The modules can remain secured to each other until an optional release mechanism is actuated. The release mechanism can be provided on an outer surface of the head-mountable device 100 for access by a user.

While the light seal element 200 is shown schematically with a particular size and shape, it will be understood that the size and shape of the light seal element 200, particularly at the inner side 214 of the light seal element 200, can have a size and shape that accommodates the face of a user wearing the head-mountable device 100. For example, the inner side 214 can provide a shape that generally matches the contours of the user's face around the eyes of the user. The inner side 214 can be provided with one or more features that allow the light seal element 200 to conform to the face of the user to enhance comfort and block light from entering the light seal element 200 at the point of contact with the face. For example, the inner side 214 can provide a flexible, soft, elastic, and/or compliant structure.

The light seal element 200 can include multiple portions that are moveable relative to each other to provide different configurations for different user experiences and/or form factors. As shown in FIG. 1, the light seal element 200 can include a main body 210 that extends from the frame 110 (e.g., at the outer side 212) and towards a user (e.g., at the inner side 214). The light seal element 200 can further include one or more peripheral portions 220 at a peripheral region of the light seal element 200. For example, as shown in FIG. 1, each of the peripheral portions 220 can extend from the frame 110 (e.g., at the outer side 212) and towards a user (e.g., at the inner side 214) in at least one configuration. The peripheral portions 220 can be positioned adjacent to the main body 210. As further shown in FIG. 1, at least a portion of each of the peripheral portions 220 can extend away from the frame 110 and beyond the main body 210. By further example, in at least one configuration, one or more of the peripheral portions 220 can define and innermost extent of the light seal element 200 (e.g., the extent farthest from the frame 110). Any number of peripheral portions 220 can be provided. The peripheral portions 220 can move relative to the main body 210, as described further herein.

The frame 110 and/or the light seal element 200 can be supported on a user's head with a head securement element, such as arms 122. The arms 122 can wrap or extend along opposing sides of a user's head and/or to a rear of the user's head. The arms 122 can optionally include earpieces for wrapping around or otherwise engaging or resting on a user's ears. It will be appreciated that other configurations can be applied for securing the head-mountable device 100 to a user's head. For example, one or more bands, straps, belts, caps, hats, or other components can be used in addition to or in place of the illustrated arms 122 of the head-mountable device 100. The head securement element can optionally include a band (not shown) for extending to and/or about a rear side of the head of the user. The band can optionally extend from ends of the arms 122. The band can be stretchable to comfortably provide tension about the head of the user. The head securement element can further include an adjustment element (not shown) for adjusting a tightness and/or fit of the head securement element, including the arms 122 and/or a band attached thereto.

As shown in FIG. 1, the head securement element can include arms 122 on opposing sides of the head-mountable device 100. Each of the arms 122 can be pivotably coupled to the frame 110. For example, the frame 110 can include extensions 120 that extend from and/or are integrally formed with the frame 110. The extensions 120 and the frame 110 can form a continuous, rigid structure. It will be understood that the extensions 120 can optimally be a portion of the frame 110 or another component of the frame 110. The arms 122 and/or the extensions 120 can include an electronic component that is provided at a location that is preferred for certain components, such as speakers to direct sound to the ears of the user.

The arms 122 can be coupled to the frame 110 by hinges 124. The hinges 124 can allow the arms 122 to pivot relative to the frame 110, for example by moving towards or away from each other. By further example, the hinges 124 can provide rotation about axes that are parallel to each other and/or that extend substantially vertically along sides of the head-mountable device 100.

Figure 2:
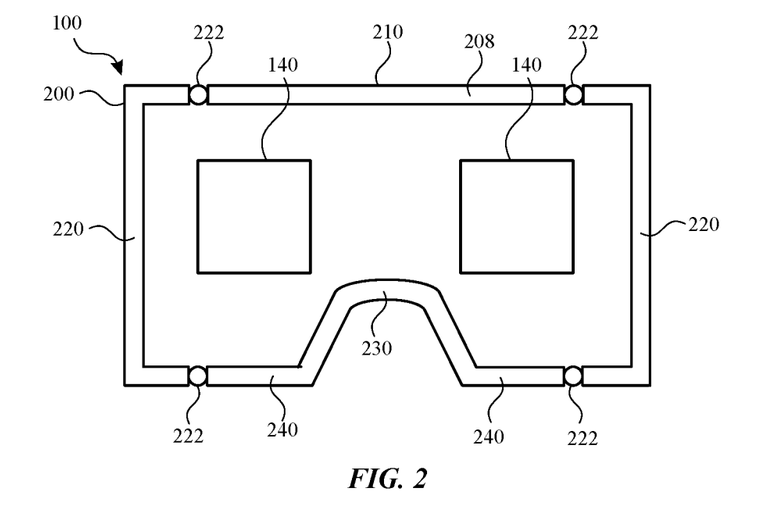
FIG. 2 illustrates a rear view of a light seal element, according to some embodiments of the present disclosure.

Referring now to FIG. 2, a light seal module can be selected with various portions that match the contours of the face of the user. At least some of these portions can be provided by the main body and/or the peripheral portions of the light seal module. For example, as shown in FIG. 2, the main body 210 of the light seal element 200 can include a forehead portion 208 for engaging the forehead of the user, a nose portion 230 for engaging the nose of the user, and cheek portions 240 for engaging the cheeks of the user. In some embodiments, these portions of the main body 210 can maintain fixed positions while worn by a user. As such, the portions of the main body can continually engage the face of the user while in use. By further example, the light seal element 200 can further include peripheral portions 220 configured to engage sides of the user's face (e.g., along the temples of the user's head). The peripheral portions 220 can alternatively engage the face and/or head of the user or be moved with respect to the main body 210 (e.g., about the pivots 222) and away from the face and/or head of the user as described further herein. It will be understood that the peripheral portions 220 can be positioned generally as shown in FIG. 2. Additionally or alternatively, the peripheral portions 220 can be positioned elsewhere with respect to the main body 210. For example, the peripheral portions 220 can, in an extended configuration, be configured to engage the forehead, cheeks, and/or nose of the user. While two separate peripheral portions 220 are shown in FIG. 2, it will be understood that any number of discrete peripheral portions 220 can be provided. For example, the number of peripheral portions 220 can be 1, 2, 3, 4, 5, 6, 7, 8, 9, or more than 9. Any two peripheral portions 220 can be separated by a portion of the main body 210 and/or adjacent to each other. The peripheral portions 220 can define any portion of the light seal element 200. The main body 210 and the peripheral portion(s) 220 can define a continuous surface (e.g., on the inner side) for engaging the face of the user.

Figure 3:
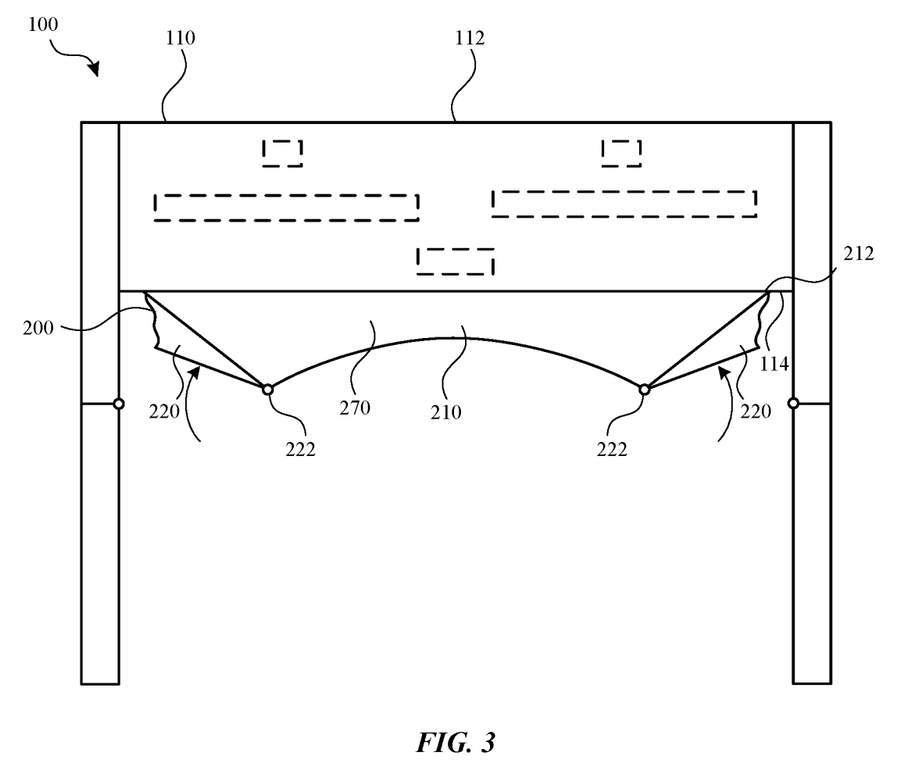
FIG. 3 illustrates a top view of a head-mountable device with a light seal element in a collapsed configuration and arms in a deployed configuration, according to some embodiments of the present disclosure.

Referring now to FIG. 3, a light seal element of a head-mountable device can transition to a collapsed configuration by allowing the peripheral portions thereof to move. FIG. 3 illustrates a top view of a head-mountable device with a light seal element in a collapsed configuration and arms in a deployed configuration, according to some embodiments of the present disclosure. As shown in FIG. 3, the light seal element 200 can transition from an extended configuration (FIG. 1) to a collapsed configuration (FIG. 3) by moving the peripheral portions 220 with respect to the main body 210. For example, the peripheral portions 220 can rotate about corresponding pivots 222 that couple the peripheral portions 220 to the main body 210. As each of the peripheral portions 220 rotates, an outer end thereof moves towards the frame 110. Optionally, the peripheral portions 220 can collapse by changing its overall size to be smaller and/or thinner. The cover 270 of the light seal element 200 can facilitate such a transition by folding on itself as needed.

While in the collapsed configuration, one or more portions of the main body 210 can define and innermost extent of the light seal element 200 (e.g., the extent farthest from the frame 110). As further shown in FIG. 3, at least a portion of the main body 210 can extend away from the frame 110 and beyond the peripheral portions 220.

Transition of the light seal element 200 between the extended configuration and the collapsed configuration can be performed manually by user. Additionally or alternatively, the transition of the light seal element 200 between the extended configuration and the collapsed configuration can be performed by the head-mountable device 100. For example, the head-mountable device can include a motor and/or actuator operatively connected to the light seal element 200. By further example, the peripheral portions 220 can be moved based on input from a user, a sensor, and/or another device. The peripheral portions 220 can optionally be biased to one or both of the extended and collapsed configurations. For example, the peripheral portions 220 can be operated with a bistable mechanism that urges the peripheral portions 220 into the nearest of either the extended configuration or the collapsed configuration.

It will be understood that the cover 270 can move to accommodate the variable thickness of the light seal element 200. For example, the cover 270 can be flexible, bendable, collapsible, foldable, or otherwise adjustable. Additionally or alternatively, one or more guides, grooves, channels, pistons, and/or chambers can be provided to facilitate movement of the peripheral portions 220 relative to the main body 210.

Figure 4:
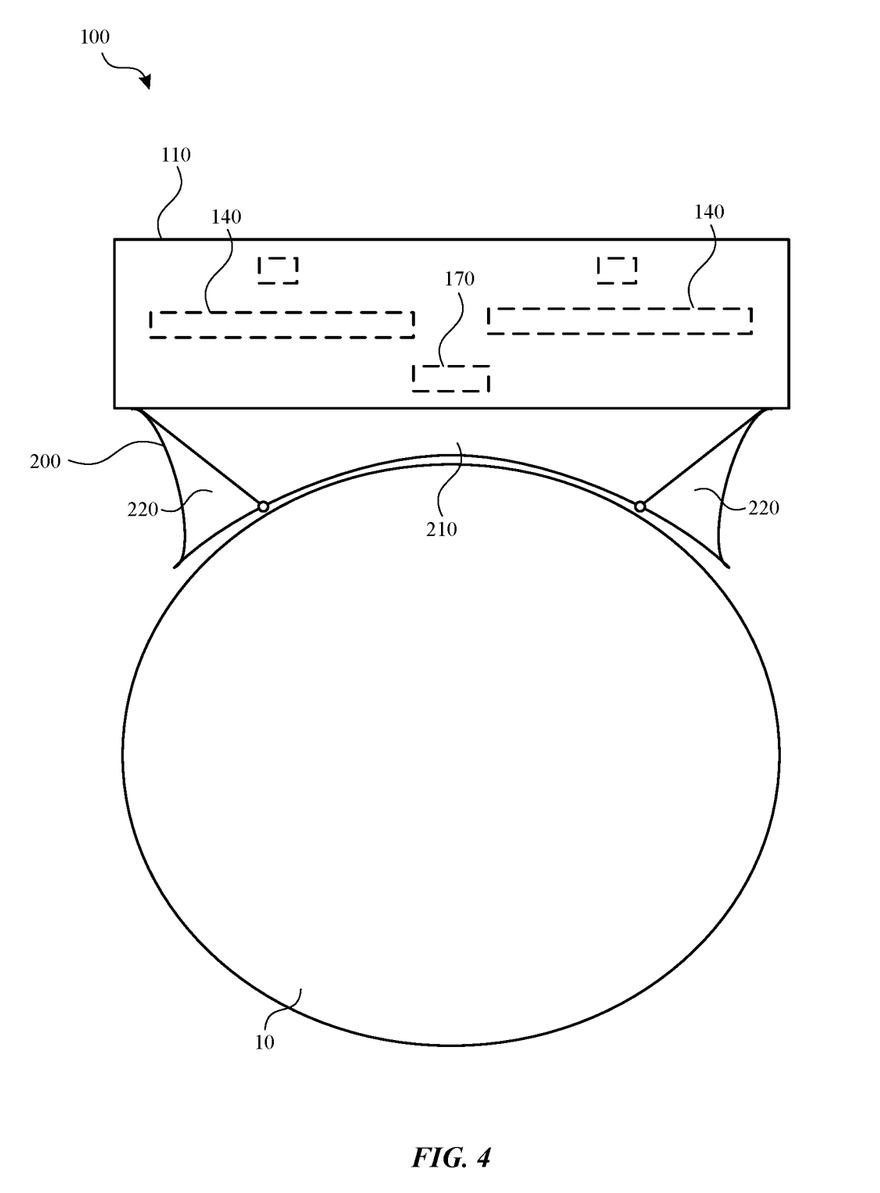
FIG. 4 illustrates a top view of a user wearing a head-mountable device with a light seal element in an extended configuration, according to some embodiments of the present disclosure.

Referring now to FIG. 4, a light seal element can be used in an extended configuration to provide an enclosed space for viewing display elements of the head-mountable device. FIG. 4 illustrates a top view of a user 10 wearing a head-mountable device 100 with a light seal element 200 in an extended configuration, according to some embodiments of the present disclosure. With the peripheral portions 220 in the extended configuration away from the frame 110 and/or the main body 210, the peripheral portions 220 can engage the face of the user 10.

The main body 210 and the peripheral portions 220 (including any cover 270 extending there across) can define an interior space through which light can pass, thereby providing to the user wearing the head-mountable device 100 a view of the display elements 140. Such a view can be enhanced by preventing the ingress of light from the external environment and into the light seal element 200. For example, both the main body 210 and the peripheral portions 220 can engage the face of the user 10 with a seal that prevents light from entering through the seal. Additionally, the sensor 170 can be provided with a view of the user 10 through the light seal element 200.

The adjustments and configurations described herein can be utilized to offer different configurations for different users. For example, the light seal element can be adjustable to accommodate features of different users, thereby providing a preferred and customizable fit. Accordingly, the same head-mountable device can be used by various users in the corresponding configuration for each user.

Figure 5:
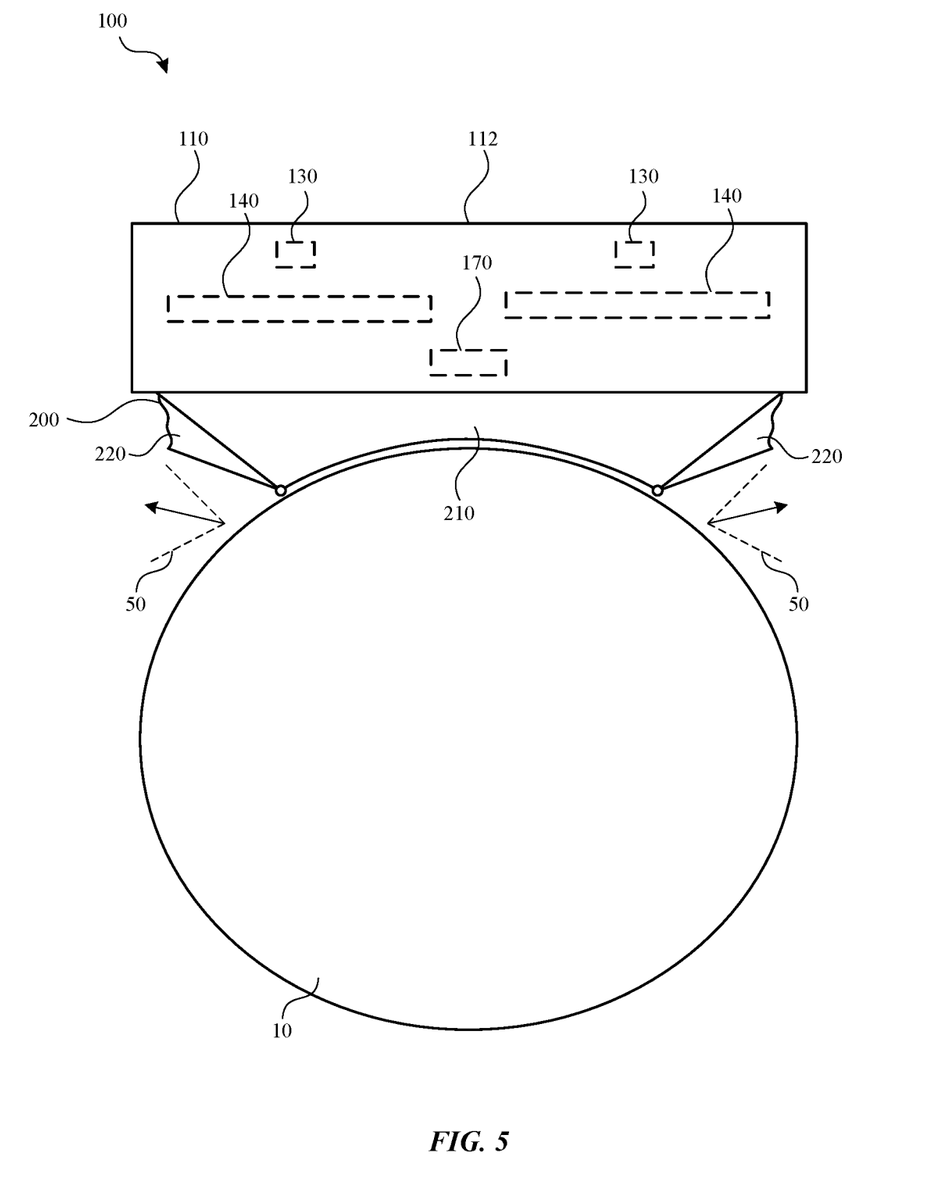
FIG. 5 illustrates a top view of a user wearing a head-mountable device with a light seal element in a collapsed configuration, according to some embodiments of the present disclosure.

Referring now to FIG. 5, a light seal element can be used in a collapsed configuration to provide a user with a view to an external environment. FIG. 5 illustrates a top view of a user 10 wearing a head-mountable device 100 with a light seal element 200 in a collapsed configuration, according to some embodiments of the present disclosure. With the peripheral portions 220 in the collapsed configuration toward the frame 110 and/or the main body 210, the peripheral portions 220 can provide a space and/or opening between the peripheral portions 220 and the face of the user 10.

As further shown in FIG. 5, the user 10 can be provided with a view 50 through the space and/or opening provided by the peripheral portions 220 in the collapsed configuration. Such a view 50 can allow the user to directly observe the external environment and be provided with information regarding objects and/or events in the external environment. Such a view 50 can further provide relief and/or a view of the external environment that is an alternative to a view captured by the cameras 130 and provided on the display elements 140.

The view 50 through the space and/or opening provided by the peripheral portions 220 can complement the view of the display elements 140 provided through the main body 210 of the light seal element 200. As such, the user 10 can simultaneously or alternatively view both the display elements 140 and the external environment.

Figure 6:
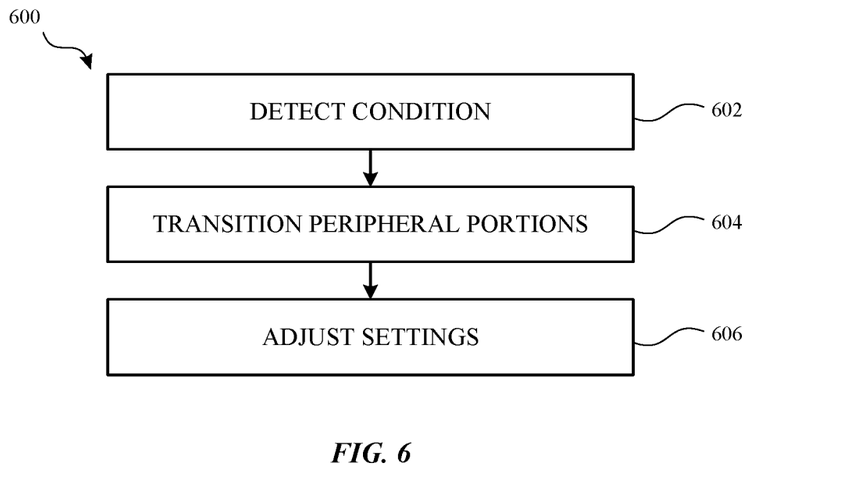
FIG. 6 illustrates a flow chart for a process having operations performed by a head-mountable device, according to some embodiments of the present disclosure.

FIG. 6 illustrates a flow chart for a process having operations performed by a head-mountable device, according to some embodiments of the present disclosure. For explanatory purposes, the process 600 is primarily described herein with reference to the head-mountable device 100 of FIGS. 1-5. However, the process 600 is not limited to the head-mountable device 100 of FIGS. 1-5, and one or more blocks (or operations) of the process 600 may be performed by different components of the head-mountable device and/or one or more other devices. Further for explanatory purposes, the blocks of the process 600 are described herein as occurring in serial, or linearly. However, multiple blocks of the process 600 may occur in parallel. In addition, the blocks of the process 600 need not be performed in the order shown and/or one or more blocks of the process 600 need not be performed and/or can be replaced by other operations.

The process 600 can begin when the head-mountable device detects a condition (602). Such a detection can be made by one or more sensors of the head-mountable device. For example, a sensor (e.g., environmental sensor, depth sensor, proximity sensor, etc.) of the head-mountable device can detect a condition of an external environment. Such a condition can include the presence of an object, device, or person in a vicinity of the user to determine whether a view of the object or person should be provided by moving peripheral portions of a light seal element. By further example, a sensor of the head-mountable device can detect a condition of a user and/or a space between the head-mountable device and the user. Such conditions can include temperature, humidity, and the like to determine whether air from an external environment should be allowed into the light seal element. Additionally or alternatively, the detection can be performed in response to an operational state of the head-mountable device (e.g., on/off state, application launch, user input command, and the like). The detection can further include the current configuration of the light seal element (e.g., collapsed or extended). Such a detection can be direct or inferred (e.g., from an amount of ambient light detected within the light seal element).

Based on the detection, the head-mountable device can transition one or more peripheral portions of a light seal element (604). Additionally or alternatively, the head-mountable device can provide a notification to the user to transition one or more peripheral portions of a light seal element. The transition can be between the collapsed configuration and the extended configuration. It will be recognized that such actions are optional, as the detection of a condition can be the basis for other further actions without requiring that the head-mountable device and/or the user transition one or more peripheral portions of a light seal element.

Based on the transition and/or a detection, the head-mountable device can adjust one or more settings for the operation thereof (606). For example, the head-mountable device can adjust output features of the display elements based on whether the light seal element is in a collapsed or extended configuration. By further example, the brightness, contrast, and/or other characteristics of the display elements can be adjusted to maintain a desired view of the display elements given the presence or absence of light from an external environment.

Figure 7:
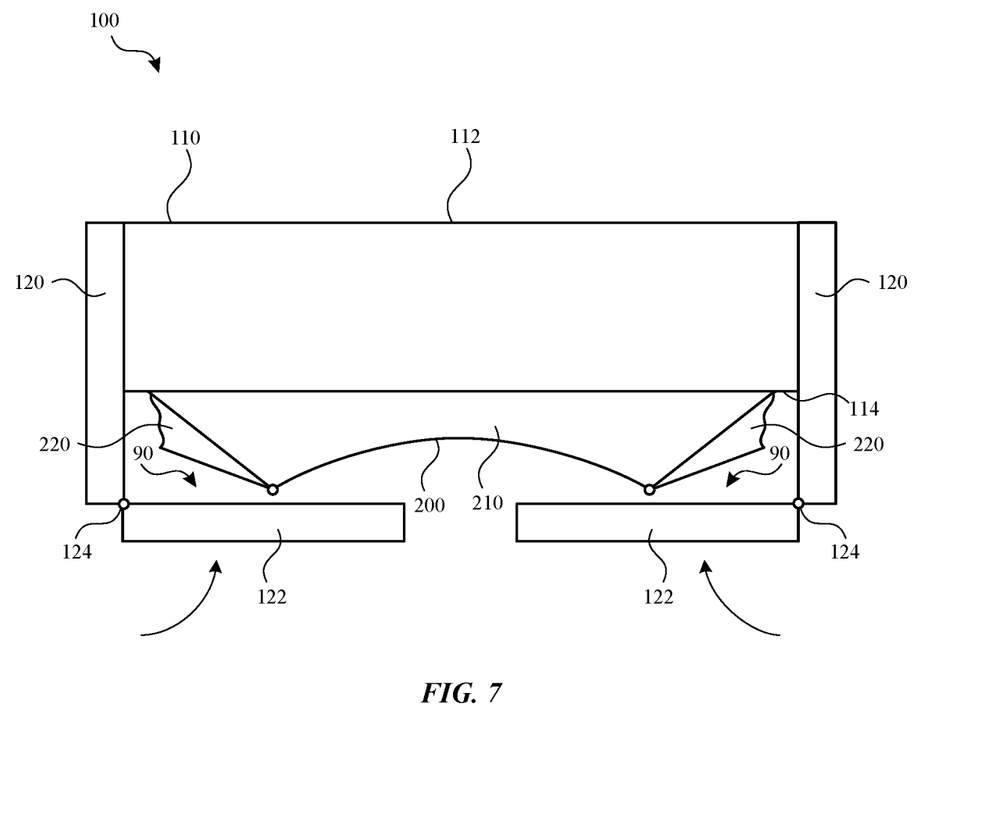
FIG. 7 illustrates a top view of a head-mountable device with a light seal element in a collapsed configuration and arms in a stowed configuration, according to some embodiments of the present disclosure.

Referring now to FIG. 7, a light seal element in a collapsed configuration can allow and/or result from movement of arms on opposing sides thereof. FIG. 7 illustrates a top view of a head-mountable device with a light seal element in a collapsed configuration and arms in a stowed configuration, according to some embodiments of the present disclosure.

While in the extended configuration (FIG. 1), the peripheral portions 220 of the light seal element 200 may obstruct the pivoting movement of the arms 122. It can be desirable to provide a collapsed configuration so that the head-mountable device 100 can be stored, transported, charged, or otherwise maintained in a compact size and shape.

As shown in FIG. 7, the arms 122 can transition from a deployed configuration (FIGS. 1 and 3) to a stowed configuration (FIG. 7). The light seal element 200, being in the collapsed configuration, can allow such movement of the arms 122. The peripheral portions 220 can move out of a space 90 to allow the arms 122 to move into the same space 90. The position of the peripheral portions 220 of the light seal element 200 while in the collapsed configuration can avoid obstructing the arms 122 and/or the hinges 124 at the space 90. As such, the arms 122 can be stowed to provide an overall smaller size and shape for the head-mountable device 100.

Additionally or alternatively, the movement of the arms 122 as they pivot about the hinge 124 can facilitate transition of the light seal element 200 from the extended configuration to the collapsed configuration. For example, the arms 122 can start from a deployed configuration and the light seal element 200 can start from an extended configuration. Subsequently, the arms 122 can be pivoted about the hinges 124. As the arms 122 pivot, the arms 122 can apply forces to the peripheral portions 220 of the light seal element 200 so that the peripheral portions 220 move relative to the main body 210 and/or the frame 110 to transition from the extended configuration to the collapsed configuration. As such, transitions of the light seal element 200 and the arms 122 can be simultaneous or sequential.

Figure 8:
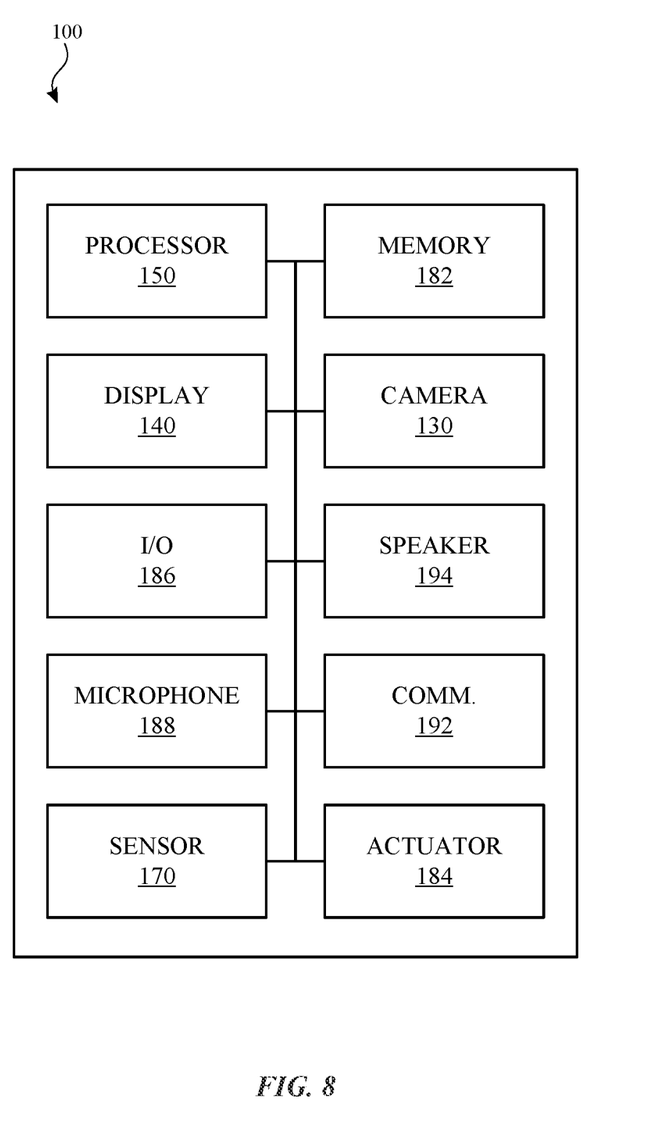
FIG. 8 illustrates a block diagram of a head-mountable device, in accordance with some embodiments of the present disclosure.

Referring now to FIG. 8, components of the head-mountable device can be operably connected to provide the performance described herein. FIG. 8 shows a simplified block diagram of an illustrative head-mountable device 100 in accordance with one embodiment of the invention. It will be appreciated that components described herein can be provided on one, some, or all of an HMD module, a light seal element, a nosepiece, and/or a securement element. It will be understood that additional components, different components, or fewer components than those illustrated may be utilized within the scope of the subject disclosure.

As shown in FIG. 8, the head-mountable device 100 can include a controller 178 (e.g., control circuitry) with one or more processing units that include or are configured to access a memory 182 having instructions stored thereon. The instructions or computer programs may be configured to perform one or more of the operations or functions described with respect to the head-mountable device 100. The controller 178 can be implemented as any electronic device capable of processing, receiving, or transmitting data or instructions. For example, the controller 178 may include one or more of: a microprocessor, a central processing unit (CPU), an application-specific integrated circuit (ASIC), a digital signal processor (DSP), or combinations of such devices. As described herein, the term "processor" is meant to encompass a single processor or processing unit, multiple processors, multiple processing units, or other suitably configured computing element or elements.

The memory 182 can store electronic data that can be used by the head-mountable device 100. For example, the memory 182 can store electrical data or content such as, for example, audio and video files, documents and applications, device settings and user preferences, timing and control signals or data for the various modules, data structures or databases, and so on. The memory 182 can be configured as any type of memory. By way of example only, the memory 182 can be implemented as random access memory, read-only memory, Flash memory, removable memory, or other types of storage elements, or combinations of such devices.

The head-mountable device 100 can further include a display element 140 for displaying visual information for a user. The display element 140 can provide visual (e.g., image or video) output. The display element 140 can be or include an opaque, transparent, and/or translucent display. The display element 140 may have a transparent or translucent medium through which light representative of images is directed to a user's eyes. The display element 140 may utilize digital light projection, OLEDs, LEDs, uLEDs, liquid crystal on silicon, laser scanning light source, or any combination of these technologies. The medium may be an optical waveguide, a hologram medium, an optical combiner, an optical reflector, or any combination thereof. In one embodiment, the transparent or translucent display may be configured to become opaque selectively. Projection-based systems may employ retinal projection technology that projects graphical images onto a person's retina. Projection systems also may be configured to project virtual objects into the physical environment, for example, as a hologram or on a physical surface. The head-mountable device 100 can include an optical subassembly configured to help optically adjust and correctly project the image-based content being displayed by the display element 140 for close up viewing. The optical subassembly can include one or more lenses, mirrors, or other optical devices.

The head-mountable device 100 can include adjustment control components described herein, such as an actuator 184, a motor, and the like for moving components to a desired relative position and/or orientation.

The head-mountable device 100 can include one or more sensors 170, as described herein. The head-mountable device 100 can include one or more other sensors. Such sensors can be configured to sense substantially any type of characteristic such as, but not limited to, images, pressure, light, touch, force, temperature, position, motion, and so on. For example, the sensor can be a photodetector, a temperature sensor, a light or optical sensor, an atmospheric pressure sensor, a humidity sensor, a magnet, a gyroscope, an accelerometer, a chemical sensor, an ozone sensor, a particulate count sensor, and so on. By further example, the sensor can be a bio-sensor for tracking biometric characteristics, such as health and activity metrics. Other user sensors can perform facial feature detection, facial movement detection, facial recognition, eye tracking, user mood detection, user emotion detection, voice detection, etc. Sensors can include a camera which can capture image based content of the outside world.

The head-mountable device 100 can include an input/output component 186, which can include any suitable component for connecting head-mountable device 100 to other devices. Suitable components can include, for example, audio/video jacks, data connectors, or any additional or alternative input/output components. The input/output component 186 can include buttons, keys, or another feature that can act as a keyboard for operation by the user.

The head-mountable device 100 can include the microphone 188 as described herein. The microphone 188 can be operably connected to the controller 178 for detection of sound levels and communication of detections for further processing, as described further herein.

The head-mountable device 100 can include one or more speakers 194. The speakers 194 can be operably connected to the controller 178 for control of audio output, including sound levels, as described further herein.

The head-mountable device 100 can include communications circuitry 192 for communicating with one or more servers or other devices using any suitable communications protocol. For example, communications circuitry 192 can support Wi-Fi (e.g., a 802.11 protocol), Ethernet, Bluetooth, high frequency systems (e.g., 900 MHz, 2.4 GHz, and 5.6 GHz communication systems), infrared, TCP/IP (e.g., any of the protocols used in each of the TCP/IP layers), HTTP, BitTorrent, FTP, RTP, RTSP, SSH, any other communications protocol, or any combination thereof. Communications circuitry 192 can also include an antenna for transmitting and receiving electromagnetic signals.

The head-mountable device 100 can include a battery, which can charge and/or power components of the head-mountable device 100. The battery can also charge and/or power components connected to the head-mountable device 100.

Accordingly, embodiments of the present disclosure provide a head-mountable device that provides a convertible light seal element that changes its size and/or shape for controlling whether light is admitter from an external environment. Such transitions can further facilitate storage, transport, and/or charging of the head-mountable device.

Various examples of aspects of the disclosure are described below as clauses for convenience. These are provided as examples, and do not limit the subject technology.

Clause A: a head-mountable device comprising: a frame; a display element supported by the frame; and a light seal element coupled to the frame and comprising: a main body; peripheral portions on opposing sides of the main body, the peripheral portions being configured to transition between: an extended configuration in which the peripheral portions extend from the frame and beyond the main body; and a collapsed configuration in which the main body extends from the frame beyond the peripheral portions.

Clause B: a head-mountable device comprising: a frame; a display element supported by the frame; a light seal element coupled to the frame and configured to transition between: an extended configuration in which a main body and peripheral portions are configured to engage a face of a user and provide a view of the display element; and a collapsed configuration in which the main body is configured to engage the face of the user and the peripheral portions are positioned to provide a view of an environment outside of the head-mountable device.

Clause C: a head-mountable device comprising: a frame; a display element supported by the frame; a light seal element comprising: a main body extending from the frame; and peripheral portions on opposing sides of the main body, the peripheral portions being configured to move into and out of corresponding spaces on a rear side of the frame; and a pair of arms, each of the arms being pivotably coupled to the frame, the arms being configured to transition between: a deployed configuration for engaging a head of a user; and a stowed configuration in which the arms are in the spaces on the rear side of the frame.

One or more of the above clauses can include one or more of the features described below. It is noted that any of the following clauses may be combined in any combination with each other, and placed into a respective independent clause, e.g., clause A, B, or C.

Clause 1: a camera configured to capture a view, wherein the display element is configured to display the view; a sensor; a microphone; and a speaker.

Clause 2: each of the peripheral portions is rotatably coupled to the main body.

Clause 3: each of the peripheral portions is coupled to the main body by a corresponding pivot.

Clause 4: the frame comprises a frame attachment element on an inner side of the frame; and the light seal element further comprises a light seal attachment element on an outer side of the light seal element, the light seal attachment element being configured to engage the frame attachment element.

Clause 5: a pair of arms, each of the arms being rigid and pivotably coupled to the frame.

Clause 6: the arms are configured to transition between a deployed configuration and a stowed configuration.

Clause 7: the main body comprises: a forehead portion configured to engage a forehead of a user; a nose portion configured to engage a nose of the user; and a cheek portion configured to engage a cheek of the user; and while the light seal element is in the extended configuration, the peripheral portions are configured to engage sides of a face of the user.

Clause 8: a sensor configured to detect a condition; an actuator configured to transition the light seal element between the extended configuration and the collapsed configuration; and a processor configured to operate the actuator based on the condition.

Clause 9: the condition is a presence of an object in a vicinity of the head-mountable device.

Clause 10: the condition is a temperature within the light seal element.

Clause 11: the condition is a humidity within the light seal element.

Clause 12: a sensor configured to detect a condition; and a processor configured to control a setting of the display element based on the condition.

Clause 13: the condition is a state of the light seal element in either the extended configuration or the collapsed configuration.

Clause 14: while the light seal element is in an extended configuration, the arms are obstructed from transitioning from the deployed configuration to the stowed configuration; and while the light seal element is in a collapsed configuration, the arms are allowed to transition from the deployed configuration to the stowed configuration.

Clause 15: the arms are biased to the stowed configuration and the light seal element is biased to the extended configuration.

Clause 16: the arms are pivotably coupled to the frame by hinges on opposite sides of the light seal element.

As described above, one aspect of the present technology may include the gathering and use of data available from various sources. The present disclosure contemplates that in some instances, this gathered data may include personal information data that uniquely identifies or can be used to contact or locate a specific person. Such personal information data can include demographic data, location-based data, telephone numbers, email addresses, twitter ID's, home addresses, data or records relating to a user's health or level of fitness (e.g., vital signs measurements, medication information, exercise information), date of birth, or any other identifying or personal information.

The present disclosure recognizes that the use of such personal information data, in the present technology, can be used to the benefit of users. For instance, health and fitness data may be used to provide insights into a user's general wellness, or may be used as positive feedback to individuals using technology to pursue wellness goals.

The present disclosure contemplates that the entities responsible for the collection, analysis, disclosure, transfer, storage, or other use of such personal information data will comply with well-established privacy policies and/or privacy practices. In particular, such entities should implement and consistently use privacy policies and practices that are generally recognized as meeting or exceeding industry or governmental requirements for maintaining personal information data private and secure. Such policies should be easily accessible by users, and should be updated as the collection and/or use of data changes. Personal information from users should be collected for legitimate and reasonable uses of the entity and not shared or sold outside of those legitimate uses. Further, such collection/sharing should occur after receiving the informed consent of the users. Additionally, such entities should consider taking any needed steps for safeguarding and securing access to such personal information data and ensuring that others with access to the personal information data adhere to their privacy policies and procedures. Further, such entities can subject themselves to evaluation by third parties to certify their adherence to widely accepted privacy policies and practices. In addition, policies and practices should be adapted for the particular types of personal information data being collected and/or accessed and adapted to applicable laws and standards, including jurisdiction-specific considerations. For instance, in the US, collection of or access to certain health data may be governed by federal and/or state laws, such as the Health Insurance Portability and Accountability Act (HIPAA); whereas health data in other countries may be subject to other regulations and policies and should be handled accordingly. Hence different privacy practices should be maintained for different personal data types in each country.

Despite the foregoing, the present disclosure also contemplates embodiments in which users selectively block the use of, or access to, personal information data. That is, the present disclosure contemplates that hardware and/or software elements can be provided to prevent or block access to such personal information data. For example, in the case of advertisement delivery services, the present technology can be configured to allow users to select to "opt in" or "opt out" of participation in the collection of personal information data during registration for services or anytime thereafter. In another example, users can select not to provide mood-associated data for targeted content delivery services. In yet another example, users can select to limit the length of time mood-associated data is maintained or entirely prohibit the development of a baseline mood profile. In addition to providing "opt in" and "opt out" options, the present disclosure contemplates providing notifications relating to the access or use of personal information. For instance, a user may be notified upon downloading an app that their personal information data will be accessed and then reminded again just before personal information data is accessed by the app.

Moreover, it is the intent of the present disclosure that personal information data should be managed and handled in a way to minimize risks of unintentional or unauthorized access or use. Risk can be minimized by limiting the collection of data and deleting data once it is no longer needed. In addition, and when applicable, including in certain health related applications, data de-identification can be used to protect a user's privacy. De-identification may be facilitated, when appropriate, by removing specific identifiers (e.g., date of birth, etc.), controlling the amount or specificity of data stored (e.g., collecting location data a city level rather than at an address level), controlling how data is stored (e.g., aggregating data across users), and/or other methods.

Therefore, although the present disclosure broadly covers use of personal information data to implement one or more various disclosed embodiments, the present disclosure also contemplates that the various embodiments can also be implemented without the need for accessing such personal information data. That is, the various embodiments of the present technology are not rendered inoperable due to the lack of all or a portion of such personal information data. For example, content can be selected and delivered to users by inferring preferences based on non-personal information data or a bare minimum amount of personal information, such as the content being requested by the device associated with a user, other non-personal information available to the content delivery services, or publicly available information.

A reference to an element in the singular is not intended to mean one and only one unless specifically so stated, but rather one or more. For example, "a" module may refer to one or more modules. An element proceeded by "a," "an," "the," or "said" does not, without further constraints, preclude the existence of additional same elements.

Headings and subheadings, if any, are used for convenience only and do not limit the invention. The word exemplary is used to mean serving as an example or illustration. To the extent that the term include, have, or the like is used, such term is intended to be inclusive in a manner similar to the term comprise as comprise is interpreted when employed as a transitional word in a claim. Relational terms such as first and second and the like may be used to distinguish one entity or action from another without necessarily requiring or implying any actual such relationship or order between such entities or actions.

Phrases such as an aspect, the aspect, another aspect, some aspects, one or more aspects, an implementation, the implementation, another implementation, some implementations, one or more implementations, an embodiment, the embodiment, another embodiment, some embodiments, one or more embodiments, a configuration, the configuration, another configuration, some configurations, one or more configurations, the subject technology, the disclosure, the present disclosure, other variations thereof and alike are for convenience and do not imply that a disclosure relating to such phrase(s) is essential to the subject technology or that such disclosure applies to all configurations of the subject technology. A disclosure relating to such phrase(s) may apply to all configurations, or one or more configurations. A disclosure relating to such phrase(s) may provide one or more examples. A phrase such as an aspect or some aspects may refer to one or more aspects and vice versa, and this applies similarly to other foregoing phrases.

A phrase "at least one of" preceding a series of items, with the terms "and" or "or" to separate any of the items, modifies the list as a whole, rather than each member of the list. The phrase "at least one of" does not require selection of at least one item; rather, the phrase allows a meaning that includes at least one of any one of the items, and/or at least one of any combination of the items, and/or at least one of each of the items. By way of example, each of the phrases "at least one of A, B, and C" or "at least one of A, B, or C" refers to only A, only B, or only C; any combination of A, B, and C; and/or at least one of each of A, B, and C.

It is understood that the specific order or hierarchy of steps, operations, or processes disclosed is an illustration of exemplary approaches. Unless explicitly stated otherwise, it is understood that the specific order or hierarchy of steps, operations, or processes may be performed in different order. Some of the steps, operations, or processes may be performed simultaneously. The accompanying method claims, if any, present elements of the various steps, operations or processes in a sample order, and are not meant to be limited to the specific order or hierarchy presented. These may be performed in serial, linearly, in parallel or in different order. It should be understood that the described instructions, operations, and systems can generally be integrated together in a single software/hardware product or packaged into multiple software/hardware products.

In one aspect, a term coupled or the like may refer to being directly coupled. In another aspect, a term coupled or the like may refer to being indirectly coupled.

Terms such as top, bottom, front, rear, side, horizontal, vertical, and the like refer to an arbitrary frame of reference, rather than to the ordinary gravitational frame of reference.

Thus, such a term may extend upwardly, downwardly, diagonally, or horizontally in a gravitational frame of reference.

The disclosure is provided to enable any person skilled in the art to practice the various aspects described herein. In some instances, well-known structures and components are shown in block diagram form in order to avoid obscuring the concepts of the subject technology. The disclosure provides various examples of the subject technology, and the subject technology is not limited to these examples. Various modifications to these aspects will be readily apparent to those skilled in the art, and the principles described herein may be applied to other aspects.

All structural and functional equivalents to the elements of the various aspects described throughout the disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. § 112, sixth paragraph, unless the element is expressly recited using the phrase "means for" or, in the case of a method claim, the element is recited using the phrase "step for".

The title, background, brief description of the drawings, abstract, and drawings are hereby incorporated into the disclosure and are provided as illustrative examples of the disclosure, not as restrictive descriptions. It is submitted with the understanding that they will not be used to limit the scope or meaning of the claims. In addition, in the detailed description, it can be seen that the description provides illustrative examples and the various features are grouped together in various implementations for the purpose of streamlining the disclosure. The method of disclosure is not to be interpreted as reflecting an intention that the claimed subject matter requires more features than are expressly recited in each claim. Rather, as the claims reflect, inventive subject matter lies in less than all features of a single disclosed configuration or operation. The claims are hereby incorporated into the detailed description, with each claim standing on its own as a separately claimed subject matter.

The claims are not intended to be limited to the aspects described herein, but are to be accorded the full scope consistent with the language of the claims and to encompass all legal equivalents. Notwithstanding, none of the claims are intended to embrace subject matter that fails to satisfy the requirements of the applicable patent law, nor should they be interpreted in such a way.

What is claimed is:

1. A head-mountable device comprising:
a frame;
a display element supported by the frame; and
a light seal element coupled to the frame and comprising:
a main body;
peripheral portions on opposing sides of the main body, each of the peripheral portions being rotatably coupled to the main body by a corresponding pivot, the peripheral portions being configured to transition between:
an extended configuration in which the peripheral portions extend from the frame and beyond the main body; and
a collapsed configuration in which the main body extends from the frame beyond the peripheral portions.

2. The head-mountable device of claim 1, further comprising:
a camera configured to capture a view, wherein the display element is configured to display the view;
a sensor;
a microphone; and
a speaker.

3. The head-mountable device of claim 1, wherein:
the frame comprises a frame attachment element on an inner side of the frame; and
the light seal element further comprises a light seal attachment element on an outer side of the light seal element, the light seal attachment element being configured to engage the frame attachment element.

4. The head-mountable device of claim 1, further comprising a pair of arms, each of the arms being rigid and pivotably coupled to the frame.

5. The head-mountable device of claim 4, wherein the arms are configured to transition between a deployed configuration and a stowed configuration.

6. A head-mountable device comprising:
a frame;
a display element supported by the frame;
a light seal element coupled to the frame and configured to transition between:
an extended configuration in which a main body and peripheral portions are configured to engage a face and provide a view of the display element and block a view to an external environment; and
a collapsed configuration in which the main body is configured to engage the face and the peripheral portions are positioned to provide the view of the external environment from within the light seal element to outside of the head-mountable device;
a sensor configured to detect an object in the external environment
an actuator configured to transition the light seal element between the extended configuration and the collapsed configuration; and
a processor configured to operate the actuator in response to a detection of the object until the light seal element is in the collapsed configuration and the peripheral portions are positioned to provide the view of the external environment.

7. The head-mountable device of claim 6, wherein:
the main body comprises:
a forehead portion configured to engage a forehead;
a nose portion configured to engage a nose; and
a cheek portion configured to engage a cheek; and
while the light seal element is in the extended configuration, the peripheral portions are configured to engage sides of the face.

8. The head-mountable device of claim 6, further comprising:
an additional sensor configured to detect a condition within the light seal element, wherein the processor is further configured to operate the actuator based on the condition.

9. The head-mountable device of claim 8, wherein the condition is a temperature within the light seal element.

10. The head-mountable device of claim 8, wherein the condition is a humidity within the light seal element.

11. The head-mountable device of claim 6, further comprising:
an additional sensor configured to detect a condition, wherein the processor is further configured to control a setting of the display element based on the condition.

12. The head-mountable device of claim 11, wherein the condition is a state of the light seal element in either the extended configuration or the collapsed configuration.

13. A head-mountable device comprising:
a frame;
a display element supported by the frame;
a light seal element comprising:
  a main body extending from the frame; and
  peripheral portions on opposing sides of the main body, the peripheral portions being configured to move into and out of corresponding spaces on a rear side of the frame; and
a pair of arms, each of the arms being pivotably coupled to the frame, the arms being configured to transition between:
  a deployed configuration for engaging a head; and
  a stowed configuration in which the arms are in the spaces on the rear side of the frame,
wherein, while the light seal element is in an extended configuration, the arms are obstructed from transitioning from the deployed configuration to the stowed configuration, and while the light seal element is in a collapsed configuration, the arms are allowed to transition from the deployed configuration to the stowed configuration.

14. The head-mountable device of claim 13, wherein the arms are biased to the stowed configuration and the light seal element is biased to the extended configuration.

15. The head-mountable device of claim 13, wherein:
the frame comprises a frame attachment element on an inner side of the frame; and
the light seal element further comprises a light seal attachment element on an outer side of the light seal element, the light seal attachment element being configured to engage the frame attachment element.

16. The head-mountable device of claim 13, wherein the arms are pivotably coupled to the frame by hinges on opposite sides of the light seal element.

* * * * *

UNITED STATES PATENT AND TRADEMARK OFFICE
CERTIFICATE OF CORRECTION

PATENT NO. : 11,733,526 B1  
APPLICATION NO. : 17/379840  
DATED : August 22, 2023  
INVENTOR(S) : Yoonhoo Jo Page 1 of 1

It is certified that error appears in the above-identified patent and that said Letters Patent is hereby corrected as shown below:

In the Claims

Column 18, Lines 35-36 (Claim 6):
"external environment"
Should read:
--external environment;--

Signed and Sealed this
Twenty-sixth Day of December, 2023

Katherine Kelly Vidal
*Director of the United States Patent and Trademark Office*